United States Patent [19]

Brahmbhatt

[11] Patent Number: 4,885,719
[45] Date of Patent: Dec. 5, 1989

[54] IMPROVED LOGIC CELL ARRAY USING CMOS E² PROM CELLS

[75] Inventor: Dhaval J. Brahmbhatt, San Jose, Calif.

[73] Assignee: ICT International CMOS Technology, Inc., San Jose, Calif.

[21] Appl. No.: 87,143

[22] Filed: Aug. 19, 1987

[51] Int. Cl.⁴ .................. G11C 11/40; H03K 19/094; H04Q 00/00
[52] U.S. Cl. ............................ 365/181; 365/185; 365/189.08; 307/469; 340/825.83; 340/825.87; 340/825.91
[58] Field of Search ............... 365/184, 185, 182, 181; 307/465, 469, 468; 364/716; 340/825.79, 825.83, 825.85, 825.86, 825.87, 825.90, 825.91, 825.93; 357/23.5

[56] References Cited

U.S. PATENT DOCUMENTS

| | | | |
|---|---|---|---|
| 4,053,798 | 10/1977 | Koike et al. | 365/181 |
| 4,228,527 | 10/1980 | Gerber et al. | 365/185 |
| 4,596,938 | 6/1986 | Cartwright, Jr. | 365/185 |
| 4,686,558 | 8/1987 | Adam | 365/181 |
| 4,710,900 | 12/1987 | Higuchi | 365/185 |

FOREIGN PATENT DOCUMENTS 0069592 4/1982 Japan .................. 365/185
0165896 7/1986 Japan .................. 365/185

OTHER PUBLICATIONS

Landry, "Logic Cell Arrays: High Density, User Programmable ASICs", Technological Horizons, Mar. 1986.

Primary Examiner—Glenn A. Gossage
Attorney, Agent, or Firm—Flehr, Hohbach, Test, Albritton & Herbert

[57] ABSTRACT

A programmable memory cell useful in a logic cell array draws no D.C. power in either a "1" or a "0" state. The cell includes a CMOS transistor pair including a p-channel transistor connected to a positive voltage source and an n-channel transistor connected to a circuit ground potential. The cell output is connected to a common terminal of the CMOS transistor pair. The CMOS transistor pair has a common floating gate which is selectively charged for programming the cell. In a preferred embodiment, the floating gate comprises a first polycrystalline silicon layer (polysilicon), and capacitive means including a second polysilicon layer spaced from and capacitively coupled with the first polysilicon layer is utilized to selectively applying charge to the common floating gate.

4 Claims, 3 Drawing Sheets

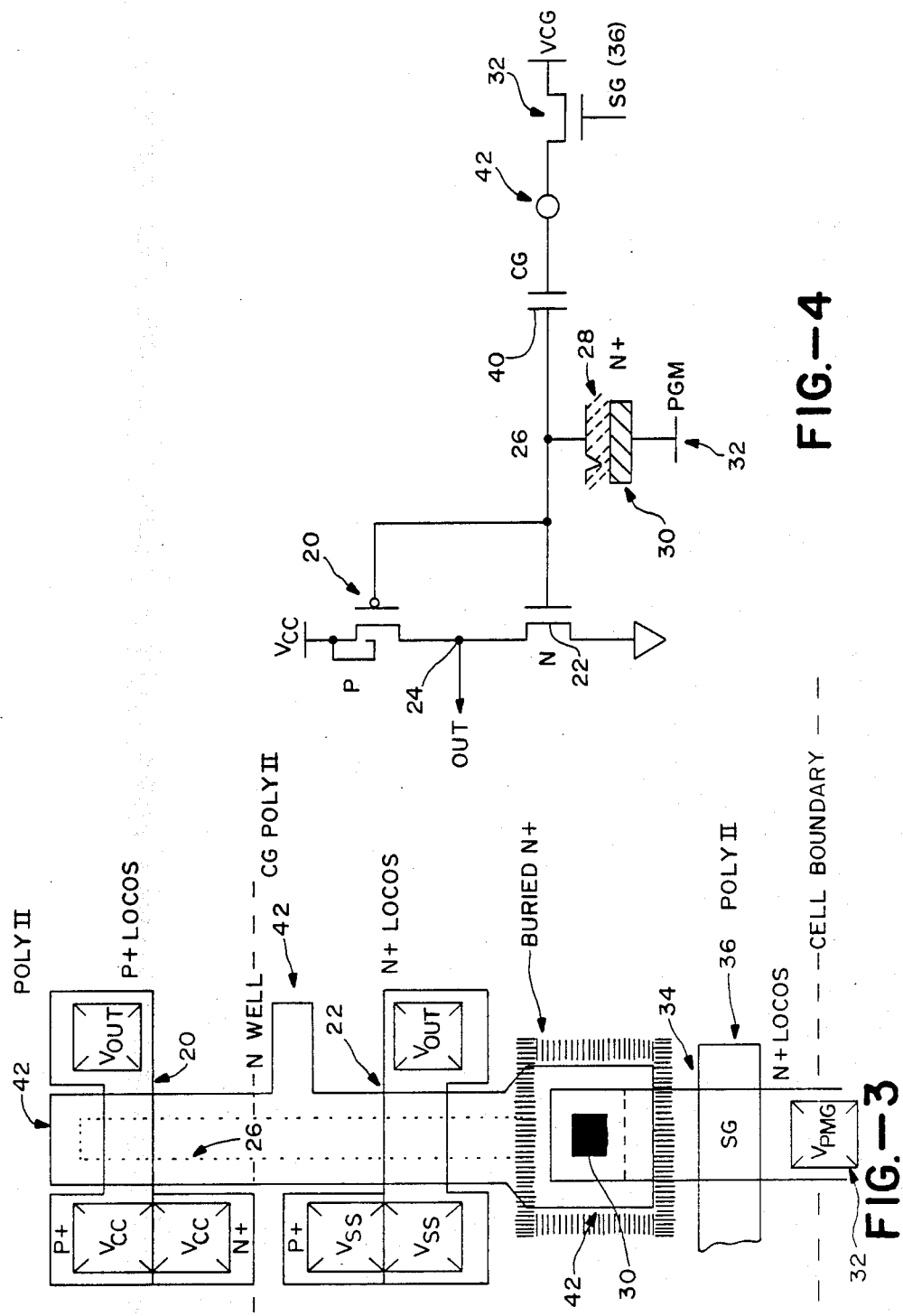

IMPROVED LOGIC CELL ARRAY USING CMOS E² PROM CELLS

BACKGROUND OF THE INVENTION

This invention relates generally to application-specific integated circuits (ASIC) and more particularly the invention relates to a logic cell array (LCA) ASIC.

ASIC devices are programmable integrated circuits which allow logic circuit designers speed and flexibility in designing logic arrays. Mask programmable gate arrays offer the highest degree of integration and flexibility, but have high, non-recurrent costs and require lengthy turn-around times. Field-programmable devices such as programmable array logic (PAL's) and programmable logic arrays (PLA's), and logic cell arrays (LCA's) provide faster turn-around at lower cost. Hower, the PAL and PLA implement only lower levels of integration with limited architectural flexibility.

The LCA is a reprogrammable device that implements complex digital logic functions and has logic capabilities equivalent to small arrays. The implementation of user logic inside the LCA is accomplished with writable memory (RAM) cells rather than dedicated integrated circuit masks (as with gate arrays) or programmable fuses (as with PAL's and PLA's). As described by Landry, "Logic Cell Arrays: High-Density, User-Programmable ASICs," *Technological Horizons,* March 1986, the LCA produced by Xilinx Corporation consists of a matrix of configurable logic blocks which are arranged in rows and columns. Interleaved between rows and columns of the configurable logic blocks are user-definable interconnection resources (wiring paths) which provide the means for routing signals between the configurable logic blocks. Within each configurable logic block, a RAM is used to directly implement combinational logic functions, instead of the typical AND-/OR gating function found in PAL's and PLA's. Arranged along the outside perimeter of the LCA die and surrounding the matrix of configurable logic blocks are input/output blocks. From an architectural point of view the LCA closely resembles a gate array in its organization yet retains the features and advantages of field-programmable logic devices.

Each cell of the conventional LCA consists of six transistors which necessitates a considerable chip area for each cell. Further, the cell provides static memory and requires reprogramming upon loss of power.

SUMMARY OF THE INVENTION

An object of the present invention is an improved application-specific integrated circuit.

Another object of the present invention is a logic cell requiring reduced chip surface area.

Yet another object of the present invention is a memory cell structure for a logic cell which provides an active output (O or $V_{cc}$) without the necessity of auxiliary circuitry.

A feature of the invention is a CMOS E² PROM cell structure.

Briefly, each memory cell of an LCA in accordance with the invention includes a CMOS transistor pair connected between $V_{cc}$ and circuit ground. The output of the cell is taken at the common terminal of the transistor pair. The two transistors have interconnected floating gates with programming means provided to selectively charge the floating gates for a "1" or "0" bit storage. Depending upon the stored bit, the output voltage from the cell will be Vcc or ground. The cell does not consume any DC power with the output being either Vcc or ground.

In a preferred embodiment, the programming means comprises capacitive means for applying a control gate voltage to the floating gate. The capacitor plates can comprise overlying polysilicon layers in a dual poly structure. A tunnel oxide separates the floating gate from a charge tunnelling electrode. The charge tunnelling electrode is connected to a programming voltage terminal through a transistor.

The cell structure is useful not only in an ASIC application but in other applications such as a redundant back-up memory and as a programmable switch.

The invention and objects and features thereof will be more readily apparent from the following detailed description and appended claims when taken with the drawings.

BRIEF DESCRIPTION OF THE DRAWING

FIG. 3 is a plan view of the layout of the cell of FIG. 2 in a semiconductor chip.

FIG. 4 is a schematic of an alternative embodiment of a memory cell in accordance with the invention.

DETAILED DESCRIPTION OF ILLUSTRATIVE EMBODIMENT

Figure 1:
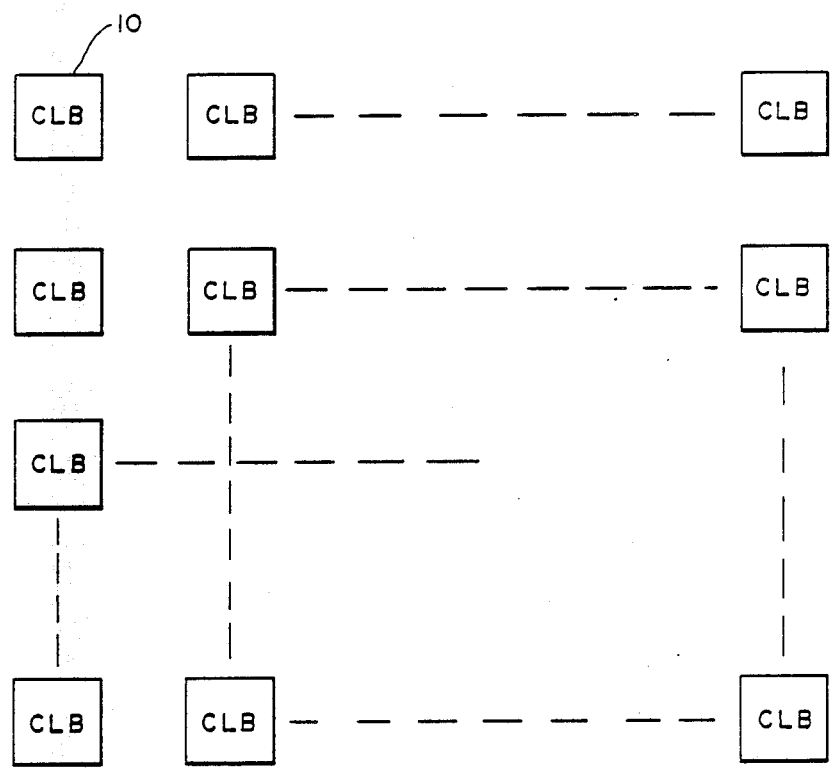
FIG. 1 is a functional block diagram of a logic cell array.

Referring now to the drawings, FIG. 1 is a schematic block diagram of a logic cell array. As described by Landry, supra, one commercially-available logic cell array comprises sixty-four configurable logic blocks (CLB) arranged in an eight-by-eight array as illustrated in FIG. 1. Each of the configurable logic blocks 10 in FIG. 1 consists of a combinational logic section with four general-purpose programming inputs, a storage element (flip-flop or latch) with a programmable clock input, and two programmable logic outputs. Each storage element, which can be either a D-type flip-flop or a gated transparent latch, includes a data input driven by the combinational logic function. As described above, the logic cell array commercially available from Xilinx Corporation utilizes a static memory cell consisting of six transistors, which necessarily require a considerable surface area on the integrated circuit. Further, the static cell loses data when power is lost and therefore must be reprogrammed.

Figure 2:
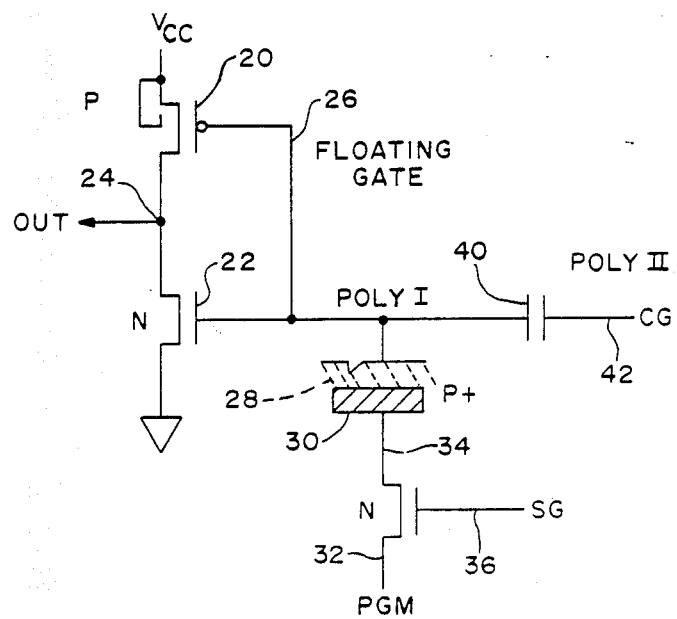
FIG. 2 is a schematic of a memory cell in accordance with the invention, useful in the logic cell array of FIG. 1.

In accordance with the present invention, an improved memory cell is provided that requires at most three transistors. Two of the transistors comprise complementary metal oxide silicon (CMOS) electrically erasable (E²) transistors. As illustrated in FIG. 2, the p-channel transistor 20 is connected to the +voltage source, $V_{cc}$, and the n-channel transistor 22 is connected to circuit ground. The output of the memory cell is taken at the common terminal 24 of the two transistors. The two CMOS transistors have a common floating gate 26 which can be electrically programmed by the tunnelling of electrons through a tunnel oxide 28 separating the floating gates from a p+ programming electrode 30. Electrode 30 is connected to a programming potential (PGM) 32 through an n-channel transistor 34. The gate of transistor 34 is connected to a select gate (SG) terminal 36.

The common floating gates is coupled through capacitor 40 to a control gate (CG) electrode 42. In one embodiment of the circuitry using dual polysilicon conductive layers, the floating gate can comprise a poly 1 layer, and the control gate can comprise a poly 2 layer. The capacitor 40 is formed where the poly 2 layer overlies the poly 1 layer.

To program a "1" at the output of the memory cell, the control gate 42 is raised to a programming voltage ($V_{pp}$) of 17 volts, the select gate is made positive ($V_{cc}$ or 17 volts) thereby rendering transistor 34 conductive, and the programming voltage (PGM) is tied to ground. Electrons from ground pass through transistor 34 and tunnel through the tunnel oxide 28 to the floating gate as attracted by the positive voltage of the control gate. The resulting negative charge on the floating gate causes the p-channel transistor 20 to conduct and the n-channel transistor 22 to not conduct, thereby applying $V_{cc}$ ("1") on the output.

Conversely, to write a "0" in the memory cell, the voltage (CG) on the control gate 42 is ground, a positive voltage is applied to the select gate (SG) rendering transistor 34 conductive, and the programming voltage (PGM) is made positive (e.g. 17 volts). In this arrangement, electrons from the floating gate tunnel through the tunnel oxide 28 as attracted by the positive potential of the programming voltage applied to the programming electrode 30 through transistor 34. Accordingly, a net positive charge is captured on the floating gate 26, thereby rendering n-channel transistor 22 conductive, and rendering p-channel transistor 20 nonconductive. The circuit ground is then conducted through transistor 22 to the output as a "0".

In a Read operation, the voltage on the poly 2 line (CG) will be 3 volts, and both SG and PGM will be grounded.

This operation is summarized in the following table:

| MODE | V-CG | V-SG | V-PGM |
|---|---|---|---|
| ERASE (to a logic 1) | 17 V | VCC or 17 V | 0 V |
| NORMAL (Read) | 3 V | 0 V | 0 V |
| WRITE (to a logic 0) | 0 V | 18 V | 17 V |

FIG. 3 is a plan view of the layout of the cell of FIG. 2 in a semiconductor chip using a conventional dual polysilicon layer process. Like elements have the same reference numerals. The p-channel transistor 20 is formed in an n-well at the top of the cell, the n-channel transistor 22 is in the middle of the cell, and the terminals 24 of the two transistors are interconnected by a metal layer (not shown). The floating gate 26 comprises a first polysilicon layer. Separate metal lines (not shown) are provided for $V_{cc}$, $V_{ss}$, and PGM. A buried n+ layer is provided under the floating gate and the tunneling area 30 to facilitate current injection to the floating gate.

FIG. 4 is an alternative embodiment of a memory cell similar to the cell of FIG. 2, and again like elements have the same reference numerals. In this embodiment, logic 1's can be selectively written instead of logic 0's as in FIG. 2. In this embodiment when PGM goes to 17 V, SG=5 V and VCG=0 V, logic 0's are loaded in all the locations at the same time where the PGM signal is common. Thereafter, to write in 1's at selected locations, SG goes to 18 V, VCG=17 V hence the selected device will have 17 V on CG. This enables the electrons from PGM (at 0 V) to tunnel to the floating gate, thus raising its threshold. In READ or NORMAL mode, PGM=0 V, SG=5 V and VCG=3 V.

Figure 5:
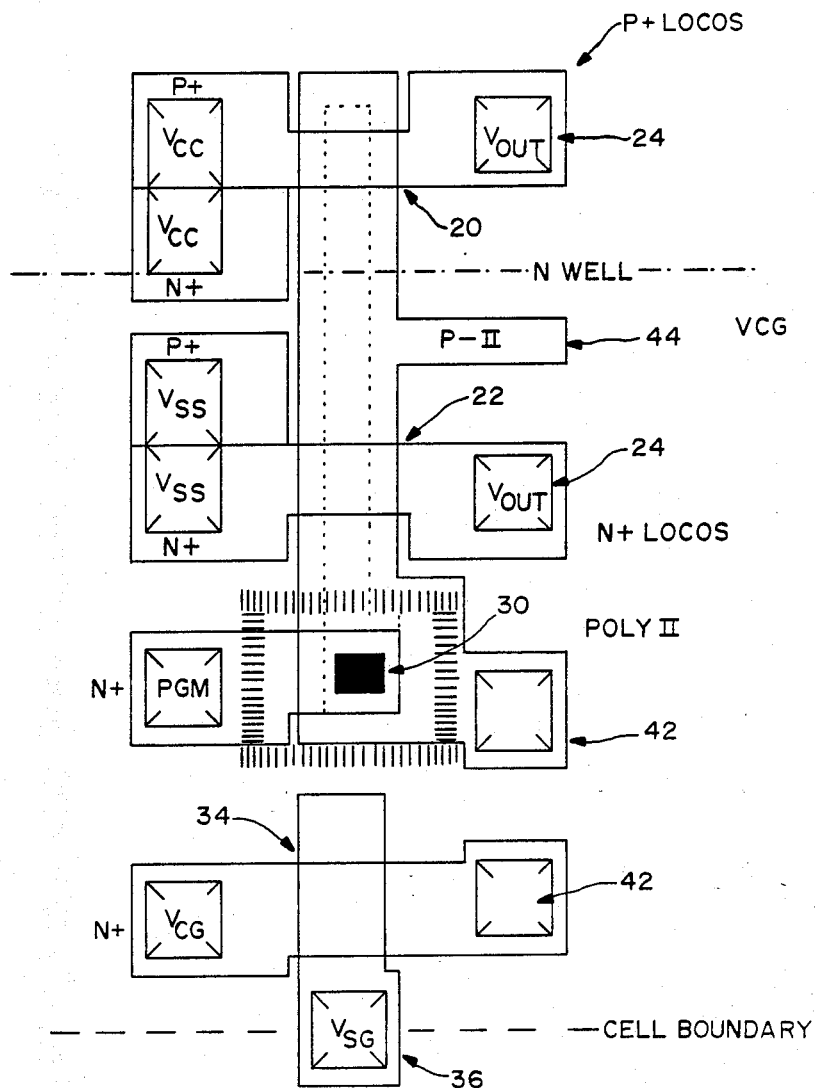
FIG. 5 is a plan view of the layout of the cell of FIG. 4 in a semiconductor chip.

The layout of FIG. 4 in silicon is shown in FIG. 5. Again, like elements have the same reference numerals.

In both FIG. 3 and FIG. 5 p+ ground and N+ Vcc contacts are provided as a protection against latch-up.

The described cells in accordance with the invention are smaller in structure due to the reduced number of transistors. Further, no D.C. power is drawn in either the "1" or the "0" state. The cell has applicability not only in a logic cell array but can be employed also as a redundant back-up memory or as a programmable switch.

While the invention has been described with reference to specific embodiments and applications, the description is illustrative of the invention and is not to be construed as limiting the invention. For example, the select transistor 34 may not be needed if separate programming lines are used in a single row of cells. Various modifications and applications may occur to those skilled in the art without departing from the true spirit and scope of the invention as defined by the appended claims.

What is claimed is:

1. A logic cell array comprising a plurality of configurable logic blocks arranged in rows and columns, each logic block including an electrically erasable programmable memory cell ($E^2PROM$), said cell having a series connected CMOS transistor pair including a p-channel transistor having a source terminal connected to a positive voltage source and an n-channel transistor having a drain terminal connected a circuit ground potential, an output connected to a common terminal of said CMOS transistor pair, said CMOS transistor pair having a common floating gate, and means for selectively charging said common floating gate including capacitive means coupled to said floating gate, a programming electrode, a tunnelling oxide separating said programming electrode and said floating gate, and a programming transistor connected to said programming electrode for applying a programming voltage to said programming electrode for cold electron injection through said tunnelling oxide to said common floating gate.

2. The logic cell array as defined by claim 1 wherein said common floating gates comprises a first polycrystalline silicon layer and said capacitive means includes a second polycrystalline silicon layer spaced from, and capacitively coupled with, said first polycrystalline silicon layer.

3. An electrically erasable programmable memory cell ($E^2PROM$) comprising a series connected CMOS transistor pair including a p-channel transistor having a source terminal connected to a positive voltage source and an n-channel transistor having a drain terminal connected to a circuit ground potential, an output connected to a common terminal of said CMOS transistor pair, said CMOS transistor pair having a common floating gate, and means for selectively charging said common floating gate including capacitive means coupled to said floating gate, a programming electrode, a tunnelling oxide separating said programming electrode and said floating gate, and a programming transistor connected to said programming electrode for applying a programming voltage to said programming electrode for cold electron injection through said tunnelling oxide to said common floating gate.

4. The program memory cell as defined by claim 3 wherein said common floating gate comprises a first layer of polycrystalline silicon material and said capacitive means comprises a second layer of polycrystalline silicon material spaced from, and capacitively coupled with, said first polycrystalline silicon material.

* * * * *